United States Patent
Taki

(10) Patent No.: US 6,495,202 B1
(45) Date of Patent: Dec. 17, 2002

(54) METHOD FOR MANUFACTURING AN OPTICAL ELEMENT CONTAINING FLUORIDE IN AT LEAST ITS SURFACE PORTIONS

(75) Inventor: Yusuke Taki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/656,737

(22) Filed: Sep. 7, 2000

(30) Foreign Application Priority Data

Sep. 8, 1999 (JP) ............................................ 11-254940

(51) Int. Cl.⁷ ................................................ B05D 5/06
(52) U.S. Cl. ........................ 427/162; 427/569; 427/596
(58) Field of Search ................................ 427/162, 164, 427/490, 535, 537, 551, 558, 569, 596

(56) References Cited

U.S. PATENT DOCUMENTS

| | | | |
|---|---|---|---|
| 4,013,796 A | | 3/1977 | Swinehart et al. |
| 4,085,248 A | * | 4/1978 | Zehender et al. ............ 427/587 |
| 4,892,402 A | * | 1/1990 | Sawamoto et al. .......... 427/519 |
| 4,961,001 A | | 10/1990 | Liegel et al. |
| 5,851,726 A | * | 12/1998 | Ikuta et al. .................. 427/554 |
| 5,932,299 A | * | 8/1999 | Katoot ......................... 427/595 |
| 6,242,041 B1 | * | 6/2001 | Katoot et al. ................ 427/595 |

FOREIGN PATENT DOCUMENTS

| | | |
|---|---|---|
| EP | 0 939 147 | 9/1999 |
| EP | 1 083 444 | 3/2001 |
| JP | 06-024807 | 2/1994 |
| JP | 06-228343 | 8/1994 |

OTHER PUBLICATIONS

J. I. Pena et al, "Changes in the optical absorption of CaF2, SrF2 and BaF2 induced by thermal annealing in different atmospheres" Mat. Res. Bull., vol. 25, pp. 757–764 (1990) XP–000960836.

B. Kumar, "Surface oxidation of CaF2 in air" Journal of the American Ceramic Society, vol. 65, No. 10, Oct. 1982 pp. C–176–8, XP–002154321.

Stefan Baunack et al., "Electron–beam–induced decomposition and oxidation of thin CaF2 layers on Si(111) studied by Auger electron spectroscopy" Surface Science, Jan. 1990, Netherlands, vol. 225 No. 3, pp. 292–300, XP–000965612.

* cited by examiner

Primary Examiner—Bret Chen
(74) Attorney, Agent, or Firm—Morgan, Lewis & Bockius LLP

(57) ABSTRACT

A method for manufacturing an optical element includes replacing fluoride atoms at a surface of the optical element. The surface is imparted with properties of substantial prevention of charge retention and/or substantial prevention of charge build-up to help maintain transmissivity in the optical element.

13 Claims, 13 Drawing Sheets

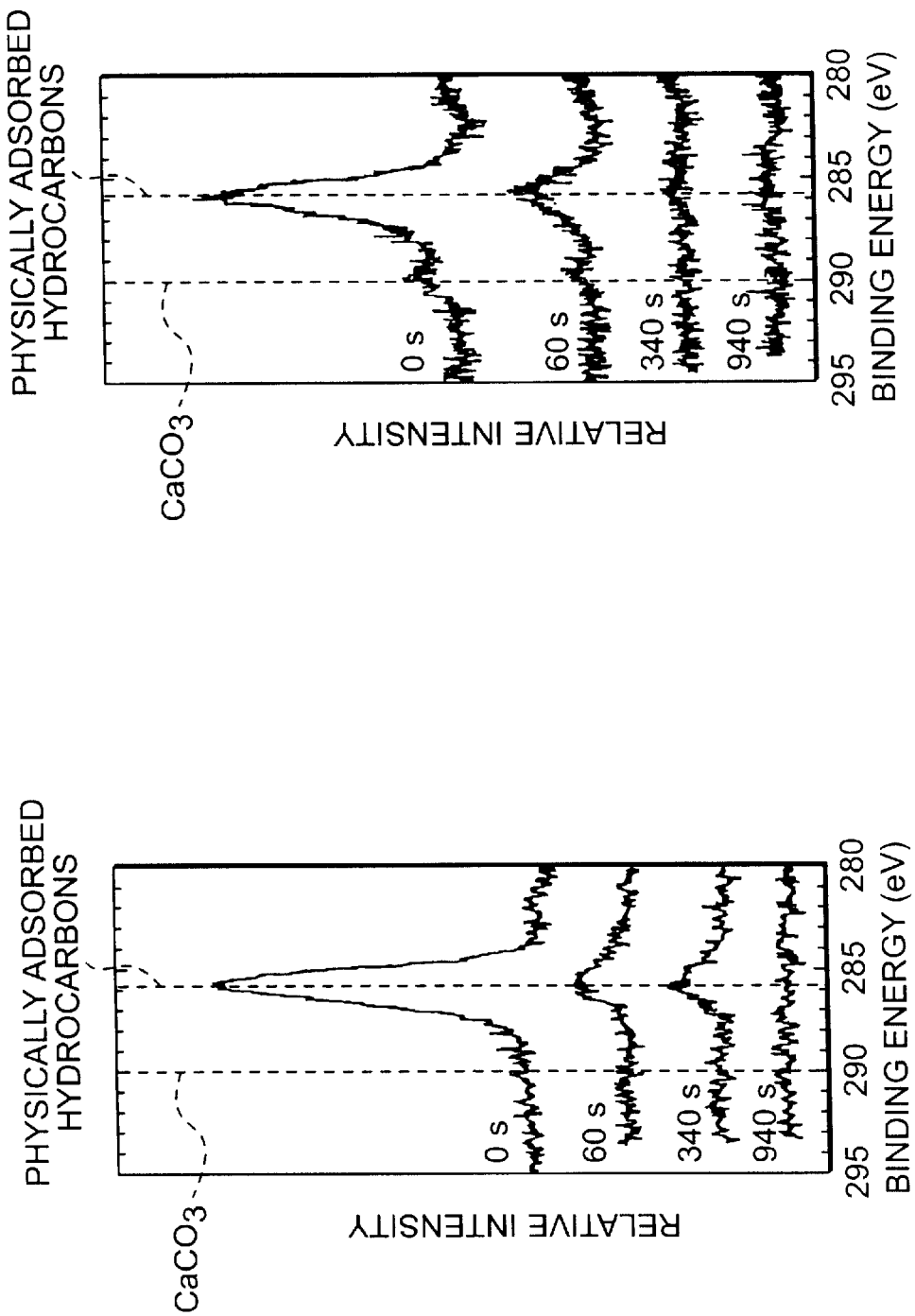

METHOD FOR MANUFACTURING AN OPTICAL ELEMENT CONTAINING FLUORIDE IN AT LEAST ITS SURFACE PORTIONS

This application claims the benefit of Japanese Application No. 11-254940, filed in Japan on Sep. 8, 1999, which is hereby incorporated by reference.

BACKGROUND OF THE INVENTION

1. Field of the Invention

The present invention relates to an optical element, and more particularly, to a method for manufacturing an optical element which contains fluoride at least in its surface portions, and further relates to an optical element which shows little drop in transmissivity over elapsed time of use. Moreover, the present invention also relates to an optical apparatus equipped with an optical system that contains the above-mentioned optical element.

2. Discussion of the Related Art

Fluoride materials are transparent over a broad light wavelength range extending from the infrared region to the ultraviolet region. Especially at wavelengths shorter than 180 nm, most fluorides are transparent, while almost all oxide materials are opaque. As a result, fluorides are indispensable materials for optical elements used in the ultraviolet region.

Since fluoride optical elements possess the above-mentioned superior optical characteristic, such optical elements are widely used in optical apparatuses such as semiconductor exposure apparatuses, microscopes, binoculars, camera lenses, telescopes, eyeglasses and medical treatment devices, etc.

However, in conventional fluoride optical elements, the problem of a drop in transmissivity occurring over time during use, which does not occur in the case of quartz glass optical elements, has been encountered. This problem is especially severe in cases where the light that is used is more in the ultraviolet region than in the visible region. In order to alleviate this problem, it is necessary to clean the optical elements occasionally during use. Accordingly, in the case of optical apparatuses such as semiconductor exposure apparatuses or medical equipment apparatuses, that are equipped with optical systems incorporating such optical elements, the maintenance time required for this necessary occasional cleaning causes a drop in the operating efficiency of the apparatus. Thus, this problem is serious.

SUMMARY OF THE INVENTION

Accordingly, the present invention is directed to an optical element, a method for making the same, and an optical apparatus using the same that substantially obviates one or more of the problems due to limitations and disadvantages of the related art.

The object of the present invention is to solve the above-mentioned problems, and to provide a fluoride optical element which shows substantially little drop in transmissivity over time, a method for manufacturing this optical element, and an optical apparatus equipped with an optical system that incorporates one or more of this optical element.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the optical element invention includes a manufacturing method to provide an optical element containing a fluoride in at least its surface portions, and replacing F atoms at the surface by OH groups or O atoms, or both.

In another aspect, the optical element invention includes a manufacturing method which provides an optical element that contains fluoride in at least its surface portions, and imparts hydrophilic properties to the surface of an optical element.

In another aspect, the optical element invention includes a manufacturing method which provides an optical element that contains fluoride in at least its surface portions, and replaces F atoms at the surface portions by OH groups or O atoms, or both; wherein the surface portions have properties including at least one of substantial prevention of charge build-up and substantial prevention of charge retention.

In another aspect, an optical element containing fluoride has a surface having hydrophilic properties as a result of OH groups or O atoms, or both that have replaced F atoms at the surface.

In another aspect, the optical element invention includes a projection exposure apparatus which projects and exposes the image of a mask pattern on a substrate using optical systems that comprise an illumination optical system which illuminates the mask with ultraviolet light as exposing light, and a projection optical system which includes a fluoride optical element which comprises a surface having hydrophilic properties, and which forms the above-mentioned mask pattern image on the substrate.

In another aspect, the optical element invention includes a projection exposure apparatus which projects and exposes the image of a mask pattern on a substrate using optical systems that comprise an illumination optical system which includes a fluoride optical element which comprises a surface having hydrophilic properties as a result of OH groups or O atoms, or both that have replaced F atoms at the surface, and which illuminates the mask with ultraviolet light as exposing light; and a projection optical system which forms the above-mentioned mask pattern image on the substrate.

In a further aspect, the optical element invention includes a projection exposure apparatus which projects and exposes the image of a mask pattern on a substrate using optical systems that comprises an illumination optical system that includes a fluoride optical element having hydrophilic properties, and which illuminates the mask with ultraviolet light as exposing light; and a projection optical system that includes a fluoride optical element having hydrophilic properties, and which forms the above-mentioned mask pattern image on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 5a shows results for fluorite prior to surface modification, while FIG. 5b shows results for fluorite following surface modification.

FIG. 6a shows results for fluorite prior to surface modification, while FIG. 6b shows results for fluorite following hydroxide surface modification.

FIG. 7a shows results for fluorite prior to surface modification, while FIG. 7b shows results for fluorite following hydroxide surface modification.

FIGS. 8a and 8b show XPS C1s spectra. FIG. 8a shows results for fluorite prior to surface modification, while FIG. 8b show results for fluorite following hydroxide surface modification.

FIG. 9a shows results for fluorite prior to surface modification, while FIG. 9b shows results for fluorite following hydroxide surface modification.

DETAILED DESCRIPTION OF THE PREFERRED EMBODIMENTS

Reference will now be made in detail to the preferred embodiments of the present invention, examples of which are illustrated in the accompanying drawings.

Figure 4:
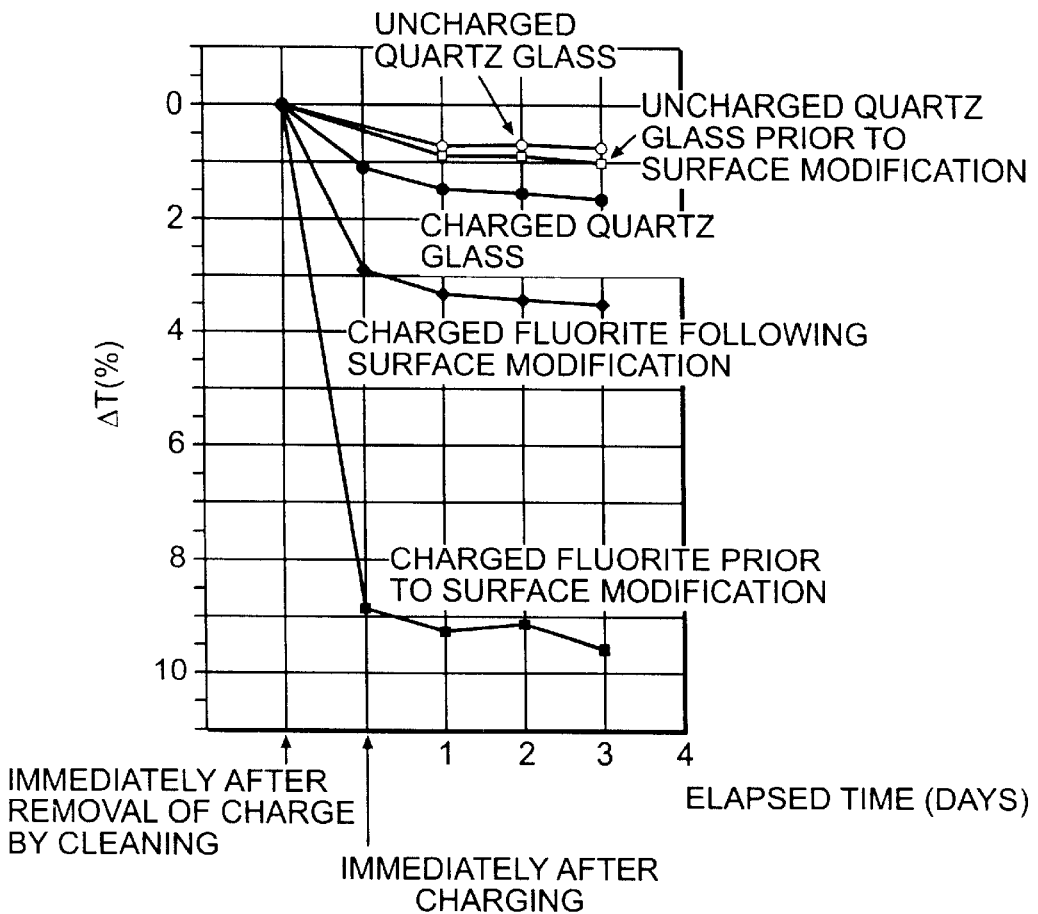
FIG. 4 is a graph which shows the change in transmissivity over time.

FIG. 4 shows the drop in transmissivity ($\Delta T$) (under various conditions) exhibited by fluorite ($CaF_2$) optical element samples and quartz glass optical element samples in the ultraviolet region (wavelength 193 nm) prior to the surface-modifying treatment of the manufacturing method of the present invention, with uncharged and charged states being compared. All of the samples initially had their charges removed by cleaning.

Charge removal by cleaning will be briefly described here. Ordinarily, cleaning is performed using an organic solvent to degrease the surface of the optical element. On the other hand, in cases where there is an excess or deficiency of electrons on the surface of an optical element so that the optical element is charged, the charged surface is cleaned with a polar solvent that has hydrophilic groups such as water or an alcohol, etc., so that the charge is completely removed. Here, therefore, cleaning is performed using an alcohol type solvent as a solvent that combines a degreasing function and a charge-removing function.

Immediately following charge removal by cleaning, the drop in the transmissivity of fluorite is zero. In the case of charged fluorite prior to surface modification, the drop in the transmissivity abruptly increases to approximately 8.9%. Even if the fluorite is allowed to stand after being charge, the drop in transmissivity increases slightly, reaching a value of approximately 9.6% after 3 days. On the other hand, the drop in transmissivity is far greater in the case of charged fluorite than in the case of uncharged fluorite, with uncharged fluorite prior to surface modification showing a drop of only about 1.0% at the same point in time. Thus, it is seen that there is an intimate relationship between charging and the drop in transmissivity. Next, in the case of the quartz glass shown in the same FIG. 4, the drop in the transmissivity rate immediately after charge removal by cleaning is zero. In the case of the charged quartz glass, the drop in the transmissivity rate increases to approximately 1% immediately after charging. Even if the quartz glass is allowed to stand after charging, there is a slight increase in the drop of the transmissivity rate, which increases to approximately 1.6% after 3 days. On the other hand, the drop in transmissivity is far greater in the case of charged quartz glass than in the case of uncharged quartz glass, with uncharged quartz glass showing a drop of only about 0.7% at the same point in time. However, quartz glass shows a far smaller drop in transmissivity than fluorite even when charged.

In order to investigate the causes of this, it is necessary to make a more detailed investigation of the conditions of charging. Accordingly, a surface potential measuring device (Mode 1 347-3, 600013-7C) manufactured by Trek was used as a means of ascertaining the degree of electrostatic charging caused by static electricity. The potentials measured by this device use the potential of a grounded metal sample stand as a reference potential. When the measured potential at the surface of the object of measurement is 0 V, this means that the surface of the object of measurement is at the same potential as the metal sample stand, thus indicating that there is no electrostatic charging of the object by static electricity.

Figure 3:
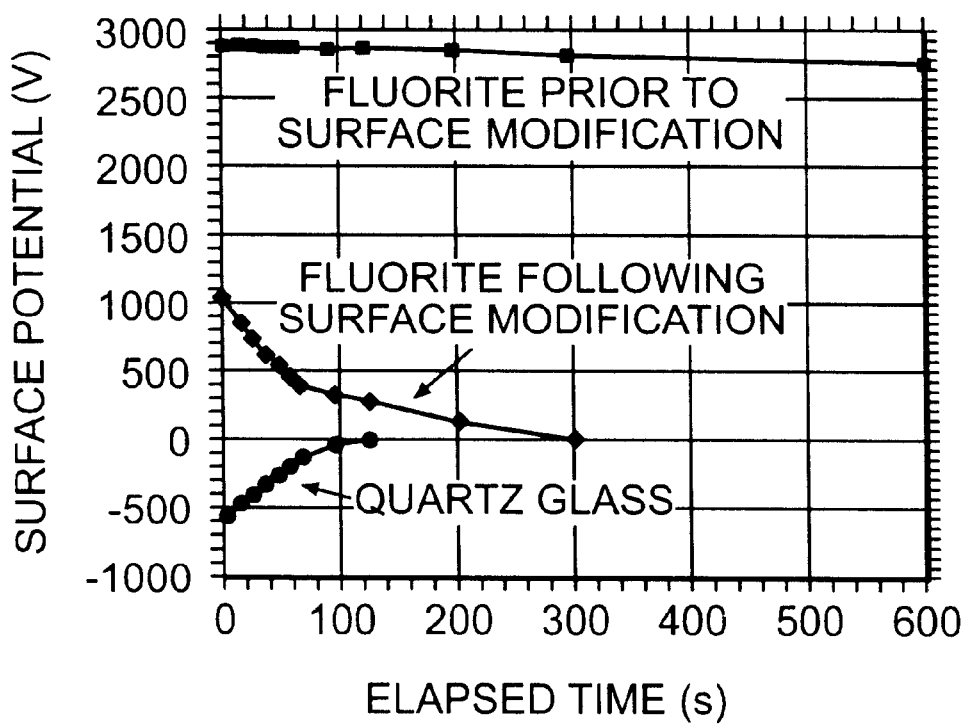
FIG. 3 is a graph which shows the change in the surface potential over time.

FIG. 3 shows the variation over time of the surface potentials of respective optical element samples of fluorite (prior to surface modification) and quartz glass having a cylindrical shape with a diameter of 30 mm and a thickness of 3 mm, as measured by using the surface potential measuring device. The surface potential of fluorite (prior to surface modification) immediately following cleaning with isopropyl alcohol was 0 V, indicating that the fluorite was in a state in which there was no charging by static electricity. Next, when this sample was intentionally subjected to a charging treatment, the surface potential rose to approximately +2900 V. When this sample was allowed to stand in a clean room controlled to a humidity of 40%, the fluorite showed almost no drop in potential even after 10 minutes. The drop in the surface potential of fluorite caused by the passage of a considerable period of time is extremely slow; thus, it is clearly seen that fluorite is inferior in terms of spontaneous charge loss characteristics (e.g., holds electrostatic charge). In contrast, the surface potential of quartz glass was approximately −600 V immediately after charging; however, this potential dropped to 0 V after 1 minute 50 seconds, thus indicating that the difficult-charging characteristics and easy charge-loss characteristics (e.g., does not hold electrostatic charge). In the present description, rises and drops in the surface potential are expressed on the basis of the absolute value of the potential.

It is known that charged objects generally attract and adsorb, as a result of the Coulomb force, substances of various sizes, ranging from polar molecules to fine particles, floating in the air. Accordingly, it is believed that the reason for the abrupt drop in the transmissivity of charged fluorite seen in FIG. 4 might well be severe contamination of the surface of the fluorite due to the attraction and adsorption by the Coulomb force of substances of various sizes, ranging from polar molecules to fine particles, floating in the air. It is further believed that the small drop in transmissivity seen in the case of quartz glass might be attributable to the fact that the charged potential of quartz glass does not show a great rise. On this basis, it is believed that a drop in transmissivity of a fluorite can be prevented by performing a surface modification treatment which has the effect of preventing a rise in the surface potential even if a charging treatment is performed, or which has the effect of causing a quick drop in the surface potential even if temporary charging does occur.

Figure 2:
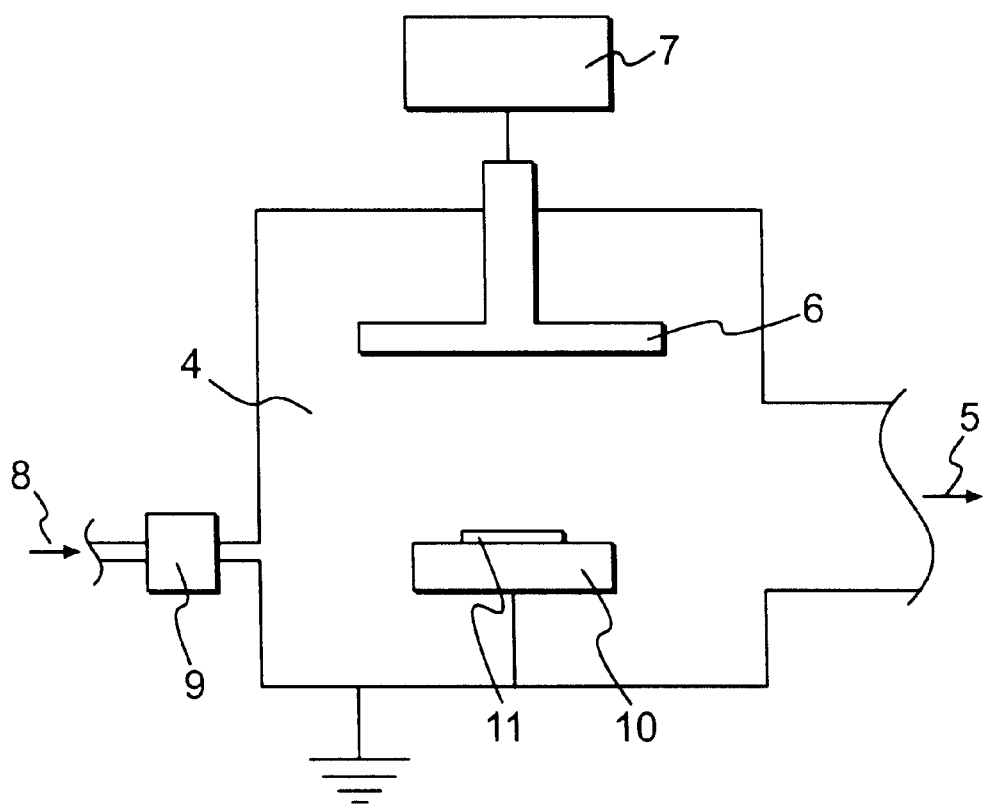
FIG. 2 shows one example of a manufacturing apparatus used in the optical element manufacturing method of the present invention.

The surface modification treatment of the manufacturing method of the present invention was performed using the apparatus of the embodiment shown in FIG. 2, with the aim of preventing a drop in the transmissivity of fluorite due to electrostatic charging.

In FIG. 2, there is a vacuum tank 4, exhaust system 5, a high-frequency electrode 6, a high-frequency power supply 7 with a frequency of 13.56 MHz, a water vapor source 8, a pressure control device 9, installed supporting electrode 10, and an optical element 11. A plasma is produced by a capacitive coupling generated between the high-frequency electrode 6 and the supporting electrode 10.

The surface modification treatment was performed by placing a fluorite optical element 11 on the supporting electrode 10 inside the vacuum tank 4. The interior of the vacuum tank 4 was then evacuated to a pressure of $10^{-5}$ Pa by means of the exhaust system 5. Afterward, water vapor was introduced into the vacuum tank 4 from the water vapor source 8, and the pressure inside the vacuum tank 4 was adjusted to 20 Pa by the control action of the pressure control device 9. At this pressure, a high-frequency power of 300 W was applied to the high-frequency electrode so that a water vapor plasma was generated between the electrodes inside the vacuum tank 4. Surface modification was then accomplished by exposing the fluorite optical element to the water vapor plasma for approximately 30 seconds. The treatment temperature was room temperature.

The drop in the transmissivity ($\Delta T$) of the fluorite sample, subjected to a surface modification treatment, was measured using ultraviolet light at a wavelength of 193 nm. The results obtained are shown in FIG. 4. According to FIG. 4, the drop in the transmissivity of the fluorite that had been subjected to the above-mentioned surface modification treatment was 0% immediately following charge removal by cleaning. When this sample was charged, the drop increased to approximately 3% immediately after charging. The drop increased slightly when the sample was allowed to stand after charging; however, the drop was only about 3.5% after 3 days. In the case of fluorite that had not yet been subjected to surface modification, this value was approximately 8.9% immediately after charging, and was 9.5% after 3 days. It is seen from a comparison of these results that the fluorite sample subjected to the above-mentioned surface modification shows a greatly decreased drop in transmissivity ( i.e., that the transmissivity of this sample tends not to drop).

Furthermore, the surface potential of the same surface-treated fluorite sample was measured. As shown in FIG. 3, the surface-treated fluorite sample showed a surface potential of +1000 V immediately after charging, and thus dropped greatly from the +2900 V measured prior to surface modification. This means that the surface-modified fluorite sample became difficult to charge ( i.e. that the difficult-charging characteristics were improved). The surface potential of the surface-treated quartz sample dropped to 0 V in 5 minutes following charging, and thus dropped greatly compared to the value of approximately +2800 V shown at the same point in time by the sample that had not yet been subjected to surface modification. This means that the fluorite sample was modified by the surface modification treatment so that the charge created by the charging of the sample was quickly lost; in other words, the easy charge-loss characteristics were improved.

Figure 5A:
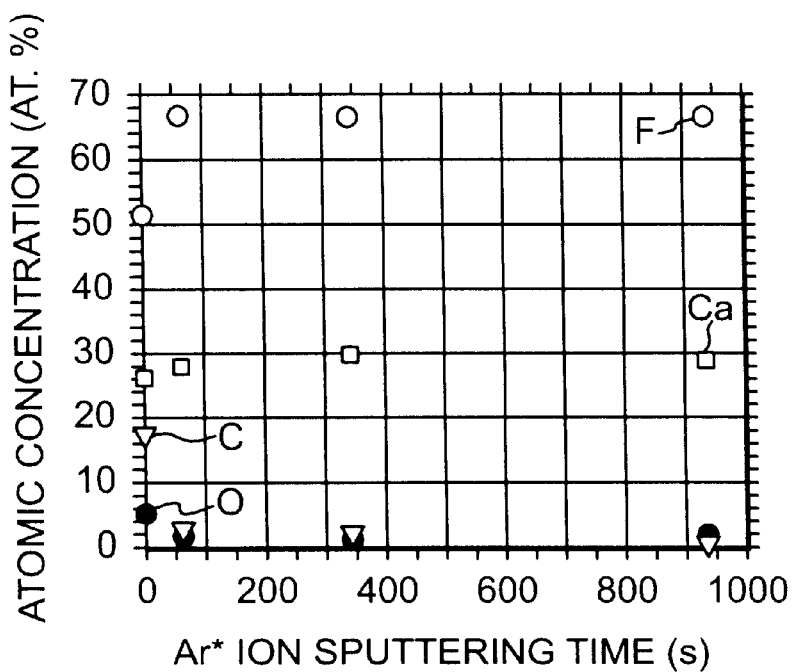
Figures 5a and 5b show XPS composition profiles in the direction of depth. Specifically.
Figure 5B:
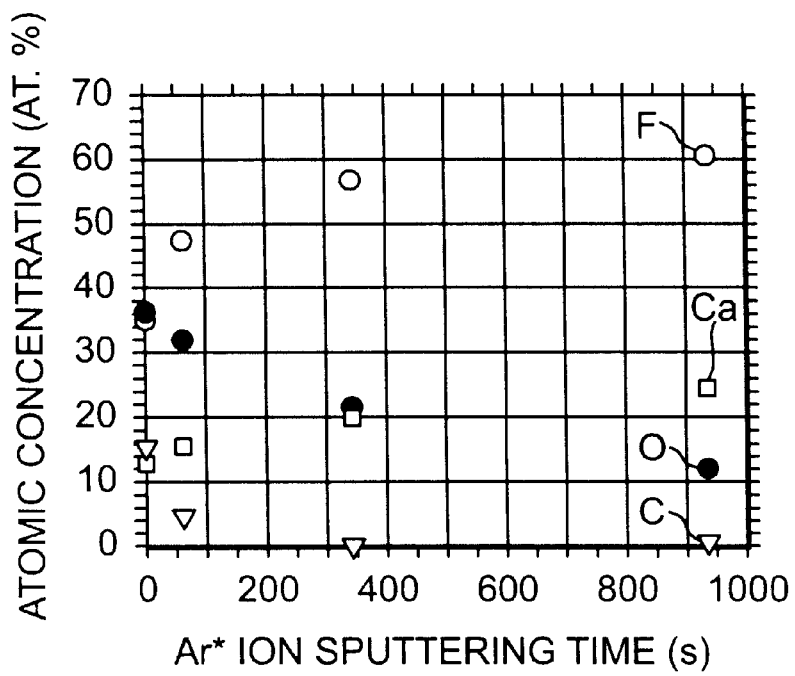

Furthermore, the state of the chemical bonds on the surface of the same fluorite sample was measured before and after surface modification. This measurement of the state of the chemical bonds was accomplished by means of X-ray photo-electron spectroscopy (XPS). Accordingly, an analysis in the direction of depth of the portions of the sample near the surface was performed by $Ar^+$ ion sputtering. Changes in the chemical composition in the direction of depth are shown for fluorite samples before and after surface modification in FIGS. 5(a) and 5(b). FIG. 5(a) shows the results obtained for a fluorite sample that had not yet been subjected to surface modification, and FIG. 5(b) shows the results obtained for a fluorite sample that had been subjected to hydroxide surface modification. The $Ar^+$ ion sputtering time corresponds to depth, meaning that a longer time indicates a greater depth. Carbon was detected from the outermost surfaces of all of the samples; however, this decreases with sputtering time. Analysis of the spectra shown in FIGS. 8(a) and 8(b) below indicated that this carbon originates in hydrocarbon contaminants absorbed on the surfaces of the fluorite samples. Furthermore, according to FIGS. 5(a) and 5(b) approximately 5% oxygen was present on the outermost surfaces of the fluorite samples prior to surface modification; this oxygen decreased with sputtering time, but was detected at the rate of approximately 2% even after 940 seconds. On the other hand, approximately 36% oxygen was present on the outermost surfaces of the fluorite samples following surface modification. The ratio of O and F atoms present (O/O+F) was approximately 0.5, so that O and F atoms were present in roughly equal numbers. The amount of oxygen decreased with sputtering time; however, approximately 13% oxygen was present even after a sputtering time of 940 seconds had elapsed. This oxygen will be described by the measurements of the X-ray photo-electron spectroscopy (XPS O1s) spectra shown in FIGS. 9a and 9b below. Furthermore, it was indicated that the fluorine concentration increased with an increase in the sputtering time in both the fluorite samples prior to surface modification and the fluorite samples following surface modification.

Next, the conditions of bonding were analyzed from the chemical shifts of the spectra of the respective elements that were detected.

Figure 6B:
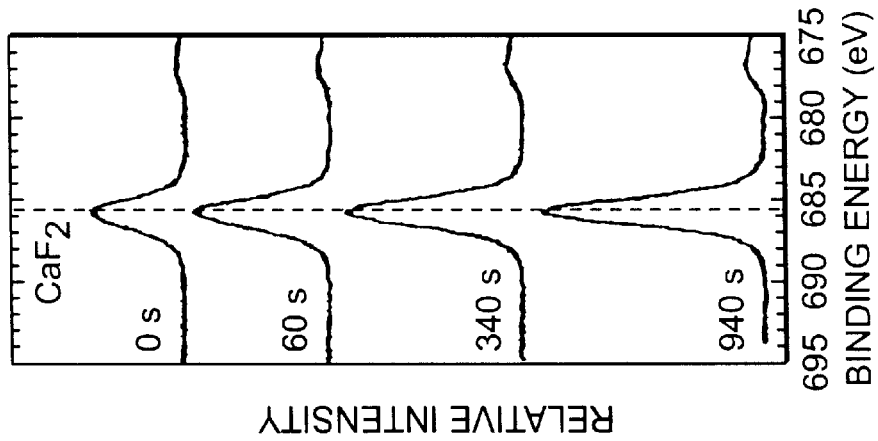
FIGS. 6a and 6b show XPS F1s spectra.
Figure 6A:
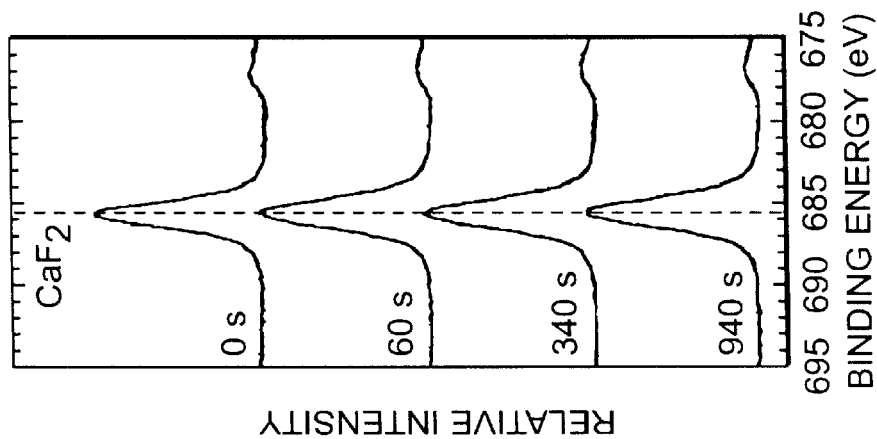

The F1s spectra of fluorite samples before and after surface modifications are shown in FIGS. 6a and 6b. FIG. 6a shows spectra for a fluorite sample before surface modification, while FIG. 6b shows spectra for a fluorite sample following hydroxide surface modification. The peak intensities of the F1s spectra correspond to the tendencies shown in FIGS. 5a and 5b, increasing with an increase in sputtering time. Meanwhile, from 0 to 940 s, the peak positions agree with positions corresponding to "the F atoms in the $CaF_2$ of the fluorite structure," and there is hardly any change in the FWHM value (full width at half maximum). Thus, it is seen that the bonding state of the F atoms shows almost no change with respect to the fluorine concentration or the direction of depth, and that these atoms are in the F atom arrangement of the fluorite structure.

Figure 7B:
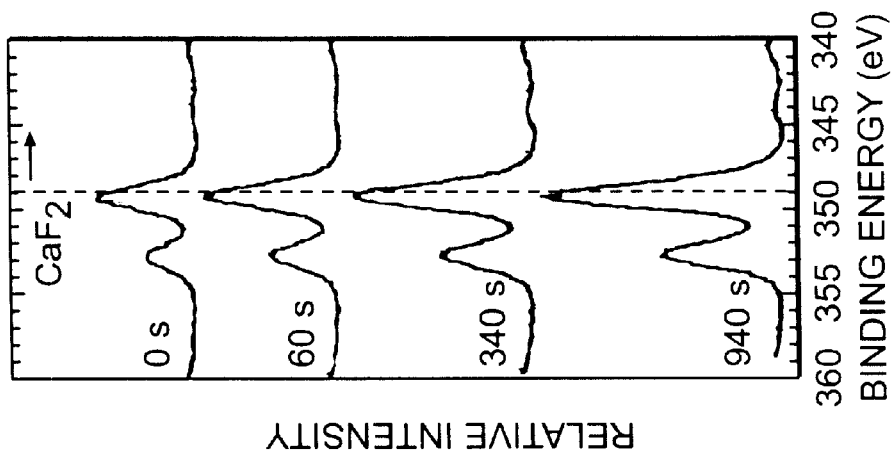
FIGS. 7a and 7b show XPS Ca2p spectra.
Figure 7A:
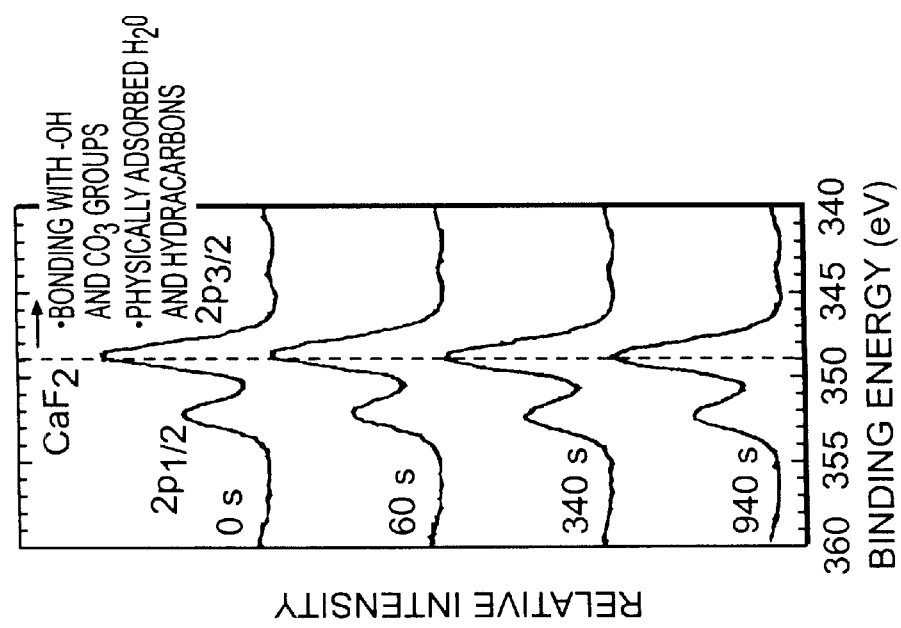

The Ca2p spectra of fluorite samples before and after surface modifications are shown in FIGS. 7(a) and 7b. FIG. 7a shows spectra for a fluorite sample before surface modification, while FIG. 7b shows spectra for a fluorite sample following hydroxide surface modification. Comparable results were obtained from both samples. Since the p orbits are not spherically symmetrical, the 2p spectra are divided into two peaks, 1/2 and 3/2, in accordance with the electron spin. As predicted by theory, the intensity of the 3/2 peaks is exactly twice the intensity of the 1/2 peaks, and the difference between the energy values of the two peaks also agrees with the theoretical value for Ca. The fact that the peak intensity ratio of the two spins is exactly 2 means that no spectra are originating in other elements, or satellite lines of any type, are superimposed on either of the spin spectra. In this case, both of the spin spectra have exactly the same shape. Accordingly, the 3/2 orbit, which has a large intensity, is used to analyze the bonding state of the Ca atoms in the fluorite samples. In FIGS. 7a and 7b the position of the Ca2p 3/2 peak is shifted more toward the low binding energy side from the intrinsic peak of the fluorite structure as [the position of measurement] approaches the outermost surface. In other words, this means that some proportion of the Ca atoms present in the vicinity of the outermost surface bond with atoms or functional groups that have a smaller electronegativity than F atoms, and thus adopt a structure that differs from the fluorite structure. As the sputtering time increases, the position of the Ca2p 3/2 peak shifts toward the intrinsic [peak] position of the fluorite structure. Specifically, as [the measurement position] moves more deeply into the interior from the surface, there is a decrease in the quantity of other types of elements such as oxygen and carbon, etc., so that most of the Ca atoms bond only with F atoms, and thus adopt a fluorite structure.

The functional groups and hetero-atoms other than F atoms that are bonded to the Ca atoms in the vicinity of this outermost surface were identified as —OH, —C0$_3$, physically adsorbed water and hydrocarbons, by the analysis shown in FIGS. 8a and 8b and FIGS. 9a and 9b below.

The C1s spectra of fluorite samples before and after surface modifications are shown in FIGS. 8a and 8b. FIG. 8a shows spectra for a fluorite sample prior to surface modification, while FIG. 8b shows spectra for a fluorite sample following hydroxide surface modification. The C1s spectrum of CaCo$_3$ and the C1s spectra of physically adsorbed hydrocarbons are recognized in the figures; in both samples, the peak intensities of these spectra decreased with increasing depth, and reached zero after 940 s. It was demonstrated from these results that almost all of the carbon detected in the vicinity of the sample surfaces was carbon originating in hydrocarbon contaminants physically adsorbed from matter suspended in the atmosphere, as a result of exposure of the samples to the atmosphere.

Figures 9A, 9B:
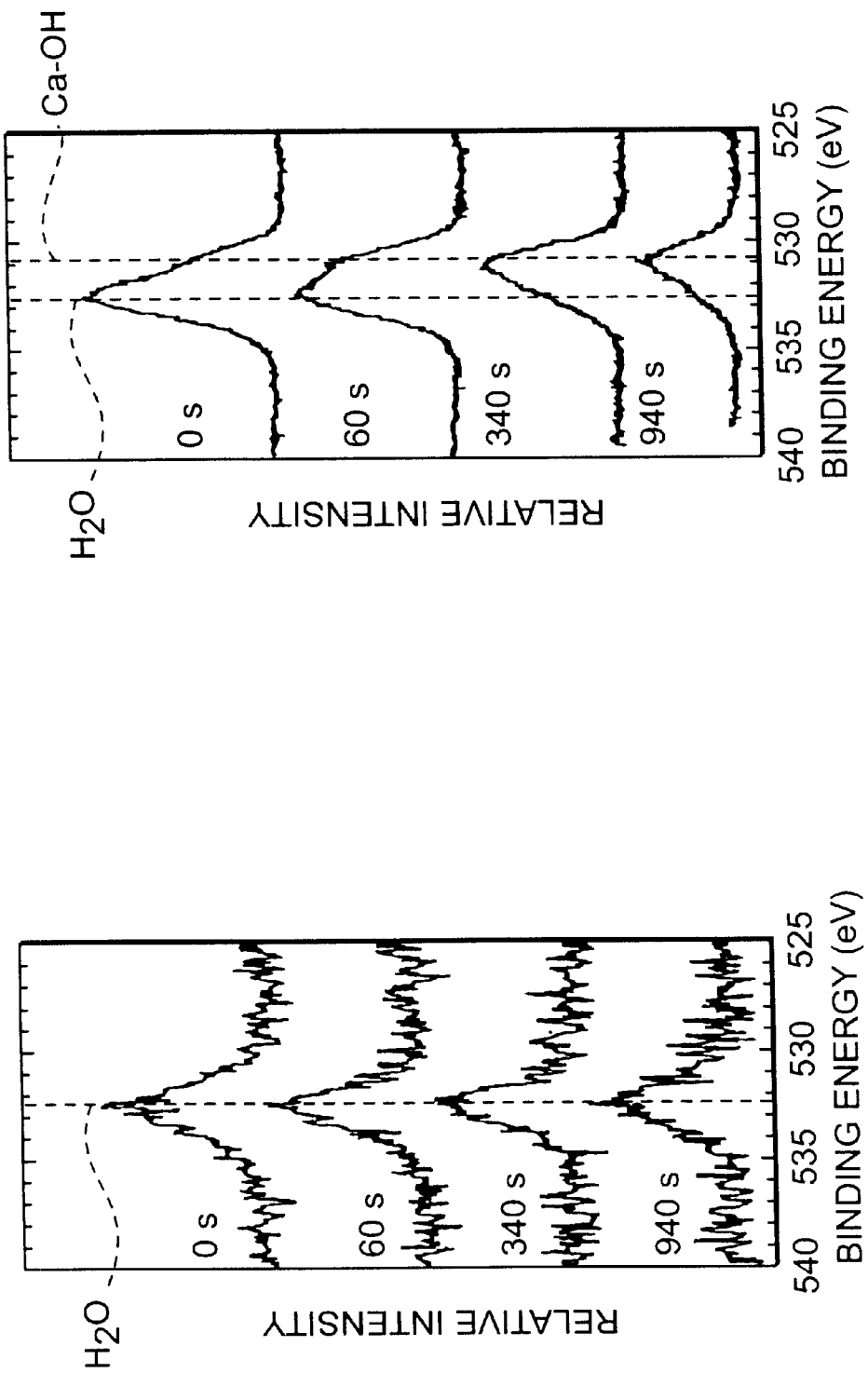
FIGS. 9a and 9b show XPS O1s spectra.

The O1s spectra of fluorite samples before and after surface modifications are shown in FIGS. 9a and 9b. FIG. 9a shows spectra for a fluorite sample prior to surface modification, while FIG. 9b shows spectra for a fluorite sample following hydroxide surface modification. The peak positions for physically adsorbed water H$_2$O and a Ca—OH bonded component are shown in the figures. Furthermore, since it was confirmed by X-ray diffraction 2θ-θ scanning and 2θ scanning (angle of X-ray incidence with respect to sample surface: 1°) analysis that the crystalline structure of calcium hydroxide Ca(OH)$_2$ was not strictly produced, we labeled the above-mentioned bonded component as "Ca—OH". It was found from FIG. 9a that the O atoms detected in the fluorite prior to surface modification merely originated in physically adsorbed water H$_2$O throughout the direction of depth. On the other hand, it was found from FIG. 9b that the O atoms detected in the fluorite following surface modification consisted of two types of O atoms (i.e. O atoms originating in physically adsorbed water and O atoms originating in Ca—OH bonds). At the outermost surface, the physically adsorbed water (H$_2$O) component was more prevalent than the Ca—OH component; however, as the sputtering time increased, the Ca—OH component became the governing factor. In other words, Ca—OH bonds were formed on the surface of fluorite subjected to the surface modification method of the present invention (i. e., the surface was made hydrophilic); consequently, water molecules present in the atmosphere were physically adsorbed as a result of exposure to the atmosphere.

From the above-mentioned XPS spectral analysis results, it was concluded that the vicinity of the surface that appears when physically adsorbed hydrocarbon contaminants and physically adsorbed water H$_2$O are removed from the outermost surface of a fluorite sample following surface modification is converted into a hydroxide. Here, XPS was used as a method for ascertaining whether or not such hydroxide modification occurred; however, it would also be possible to use ATR infrared absorption analysis, etc., besides XPS.

Thus, the following facts were ascertained from FIGS. 3 and 4 and from an analysis of the measurement results obtained by XPS. Fluorite intrinsically has characteristics which are such that charging is easy and removal of the charge is difficult. Once fluorite has been charged, the charge is not readily lost. Accordingly, as a result of the Coulomb force, contaminant substances in the atmosphere are attracted, and are adsorbed or caused to adhere to the surface, so that the surface is severely contaminated, thus causing a great drop in the transmissivity. As a result of treatment by the surface modification method of the present invention, F atoms at the surface of the fluorite are replaced by OH groups; consequently, the surface is made hydrophilic so that the intrinsic easy-charging/difficult charge-loss characteristics of fluorite are modified, thus producing an effect that results in difficult-charging characteristics/easy charge-loss characteristics. Accordingly, the charged potential of the fluorite drops, and even if the fluorite is charged, this charge is quickly lost. Consequently, there is less adhesion or adsorption of contaminant substances present in the atmosphere; as a result, it is evident that the degree of contamination of the fluorite surface is lessened, so that the drop in transmissivity is greatly curtailed.

On the basis of the above-mentioned argument, an appropriate degree of humidity is necessary in the environment in which the optical element of the present invention is used, in order to create hydrophilic properties in the optical element over a long period of time so that the charged potential can be maintained at a low level. An excessively high humidity will have deleterious effects such as fog or condensation, on the optical element; accordingly, a desirable humidity range is 30% to 50%.

In the apparatus shown in FIG. 2, the gas that is introduced is water vapor; however, besides water vapor, it would also be possible to use oxygen, ozone, hydrogen peroxide or a mixed gas of oxygen and hydrogen. In the case of oxygen or ozone, the F atoms at the surface are replaced by O atoms, while in the case of hydrogen peroxide or a mixed gas of oxygen and hydrogen, the F atoms at the surface are replaced by OH groups, or by OH groups and O atoms.

Furthermore, in the above-mentioned embodiment, the excitation-activation of the introduced gas was accomplished by means of a plasma generated by the application of high-frequency power; however, this plasma could also be generated by means of a direct current or microwaves, or a magnetron could also be added. Furthermore, besides such a plasma, it would also be possible to use one or more means selected from a set consisting of laser irradiation, heating, and bombardment with accelerated particles. Such accelerated particles include one or more types of particles selected from a set consisting of ion beams, electron beams and beams of neutral species, etc.

Furthermore, it has been confirmed that the ratio (O/O+F) at the surface of the fluorite following surface modification can be caused to adopt any desired ratio between 0 and 1 by varying the pressure inside the vacuum tank during the surface modification treatment, the high frequency output and/or the treatment time. The drop in the transmissivity of a fluorite sample that was modified to an O ratio of 1 ( i.e. O/(O+F)=1) showed superior results that were more or less comparable to the results obtained for the quartz glass shown in FIG. 4. The surface potential of this sample was almost the same as that of the quartz glass shown in FIG. 3. Furthermore, the O ratio following surface modification is obtained by adding the component originating in the O of the OH groups substituted [for F atoms] by the surface modification, and the component originating in the O of water physically adsorbed from the atmosphere following surface modification.

As a result of the fact that the drop in transmissivity shown by optical elements surface-modified by the manufacturing method of the present invention is extremely small, no drop was seen even after wiping with alcohol.

Figure 1:
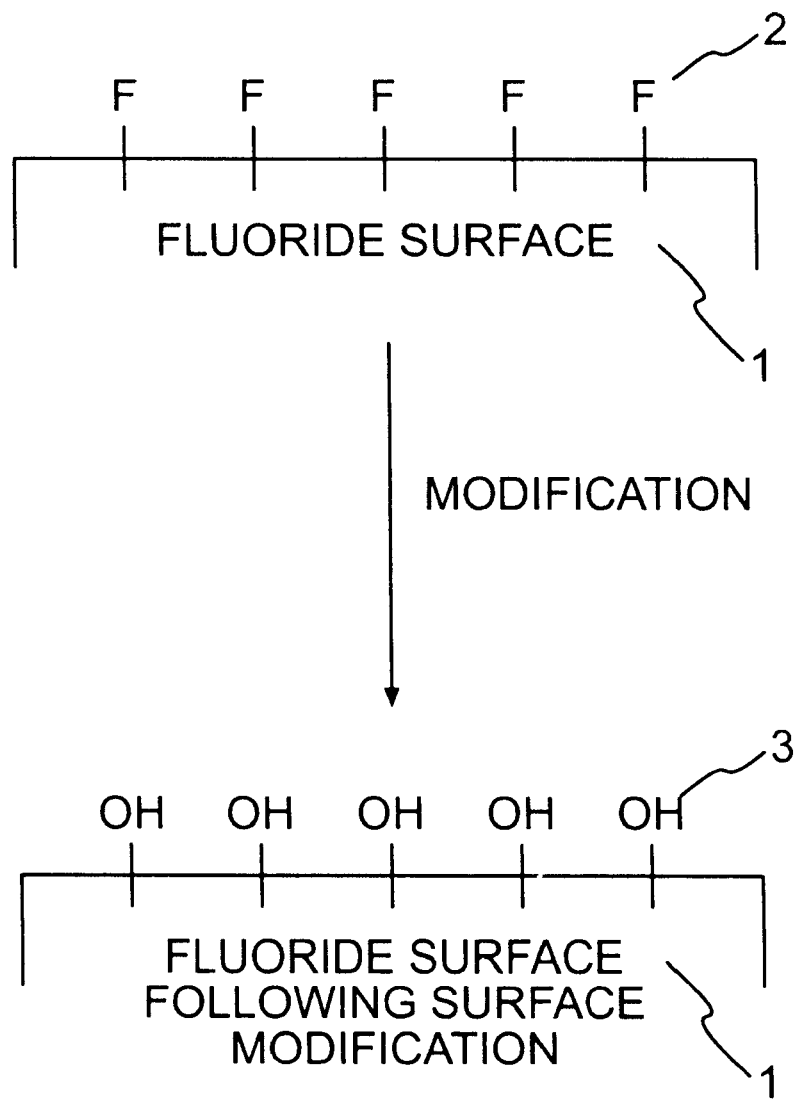
FIG. 1 is a schematic diagram which illustrates the fluoride surface before and after surface modification.

FIG. 1 schematically illustrates the conditions of surface modification of the surface of a fluoride optical element by the manufacturing method of the above-mentioned embodiment. In FIG. 1, 1 indicates a fluoride material, 2 indicates F atoms at the surface, and 3 indicates OH groups at the surface. Prior to surface modification, the fluoride material 1 is terminated by F atoms 2. As a result of the surface treatment, in which the surface is exposed to a water vapor plasma, the F atoms 2 at the surface of the fluoride material 1 are replaced by OH groups 3. As a result of being terminated by OH groups 3, the surface of the fluoride material 1 is modified from a hydrophobic surface to a hydrophilic surface, so that this surface is endowed with difficult-charging characteristics and easy charge-loss characteristics comparable to those of an oxide material. Consequently, there is little adhesion or adsorption of contaminant substances from the atmosphere, so that there is little contamination of the surface. Accordingly, the drop in transmissivity is curtailed.

As described above, it was confirmed that the surface of the fluoride material (substrate) on which no film had yet been formed could be subjected to a hydrophilicizing treatment by means of a water vapor plasma, and that the surface that was thus hydrophilicized exhibited difficult-charging characteristics and easy charge-loss characteristics. Of course, only the surface of the fluoride material was hydrophilicized; the matrix material itself remained as a fluoride.

Figure 10:
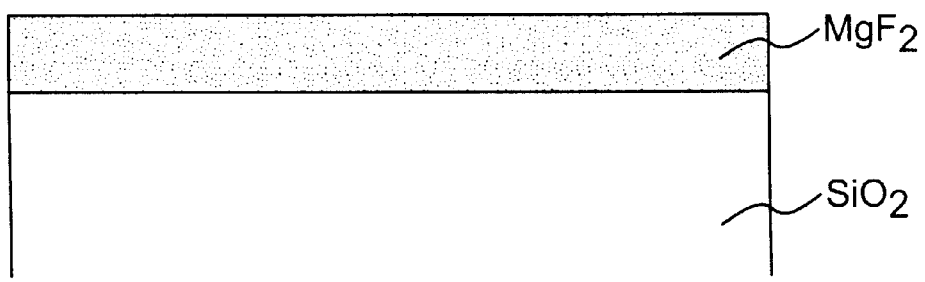
FIG. 10 shows a structural diagram of the optical element of the present invention.

Next, an embodiment in which a similar hydrophilicizing treatment was successfully performed on a fluoride thin film will be described. As shown in FIG. 10, a magnesium fluoride film was deposited on a quartz glass substrate so that the optical film thickness (refractive index×physical film thickness) was $\lambda/4$ ($\lambda=193$ nm). In this case, the film functions as a single-layer anti-reflection film at 193 nm. This single-layer magnesium fluoride film was subjected to a water vapor plasma treatment under exactly the same conditions as the above-mentioned fluorite on which no film had yet been formed. When the surface conditions of the magnesium fluoride film following this treatment were analyzed by XPS, Mg—Oh bonds were recognized. In other words, the surface of the magnesium fluoride thin film was successfully hydrophilicized in the same manner as the above-mentioned fluorite.

Figure 11:
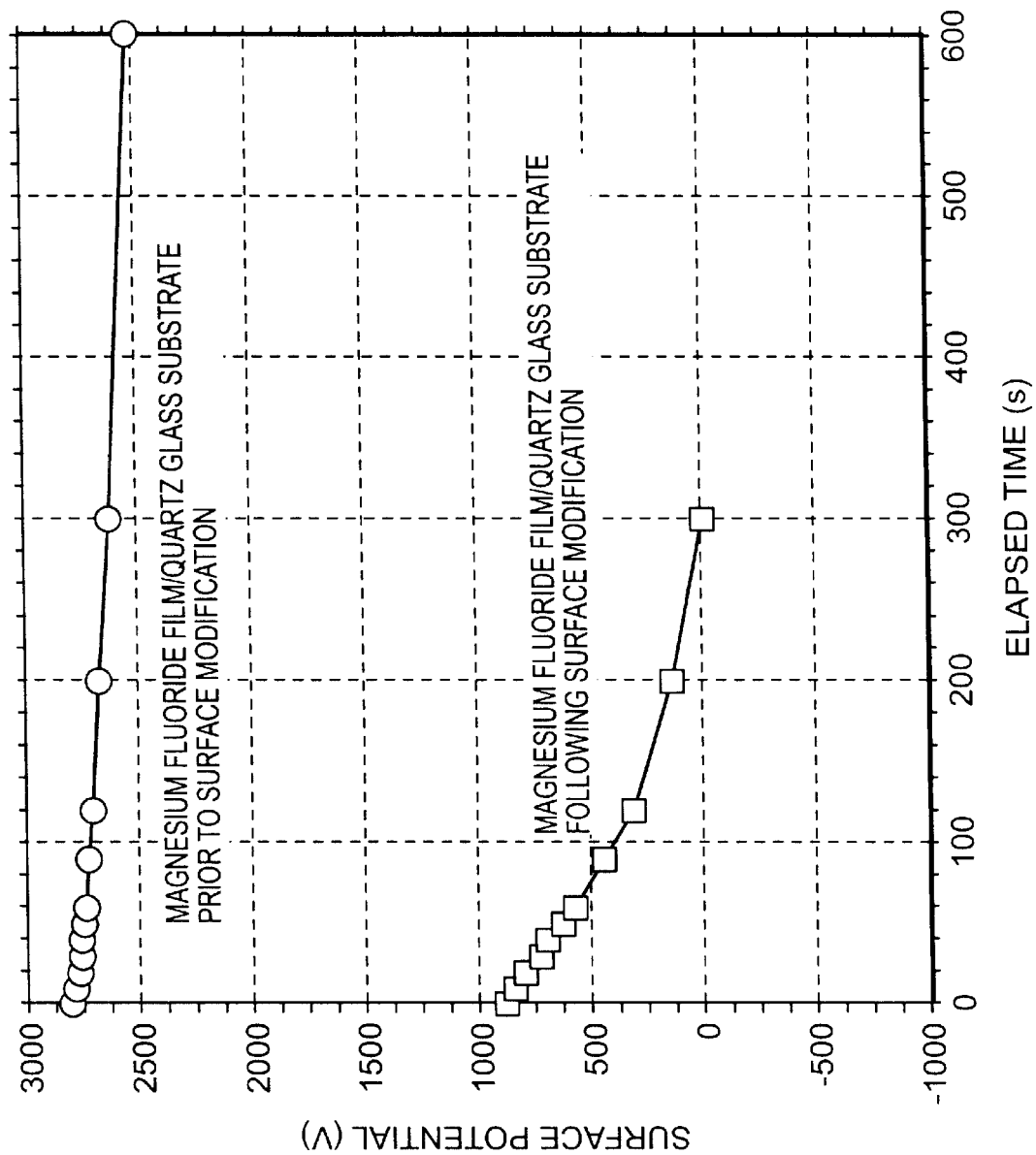
FIG. 11 is a graph which shows the change in the surface potential of the optical element of the present invention over time during use.

FIG. 11 shows the charging characteristics of the magnesium fluoride film/quartz glass substrate before and after the hydrophilicizing treatment. Prior to the hydrophilicizing treatment, the sample was highly charged to +2800 V on the plus side, as in the case of the above-mentioned fluorite on which no film had yet been formed. Even with the passage of time, the charged potential showed only a slight decrease. In other words, this sample exhibited easy-charging/difficult charge-loss characteristics. On the other hand, following the hydrophilicizing treatment, there was no change in the tendency toward charging to the plus side as a result of a charging treatment; however, the charged potential value itself dropped to +890 V; notably, furthermore, the surface potential quickly decreased with elapsed time, reaching 0 V after 300 seconds, so that the charge was completely lost. In other words, the surface of the magnesium fluoride film subjected to the above-mentioned hydrophilicizing treatment was endowed with difficult-charging/easy-charge loss characteristics.

Figure 12:
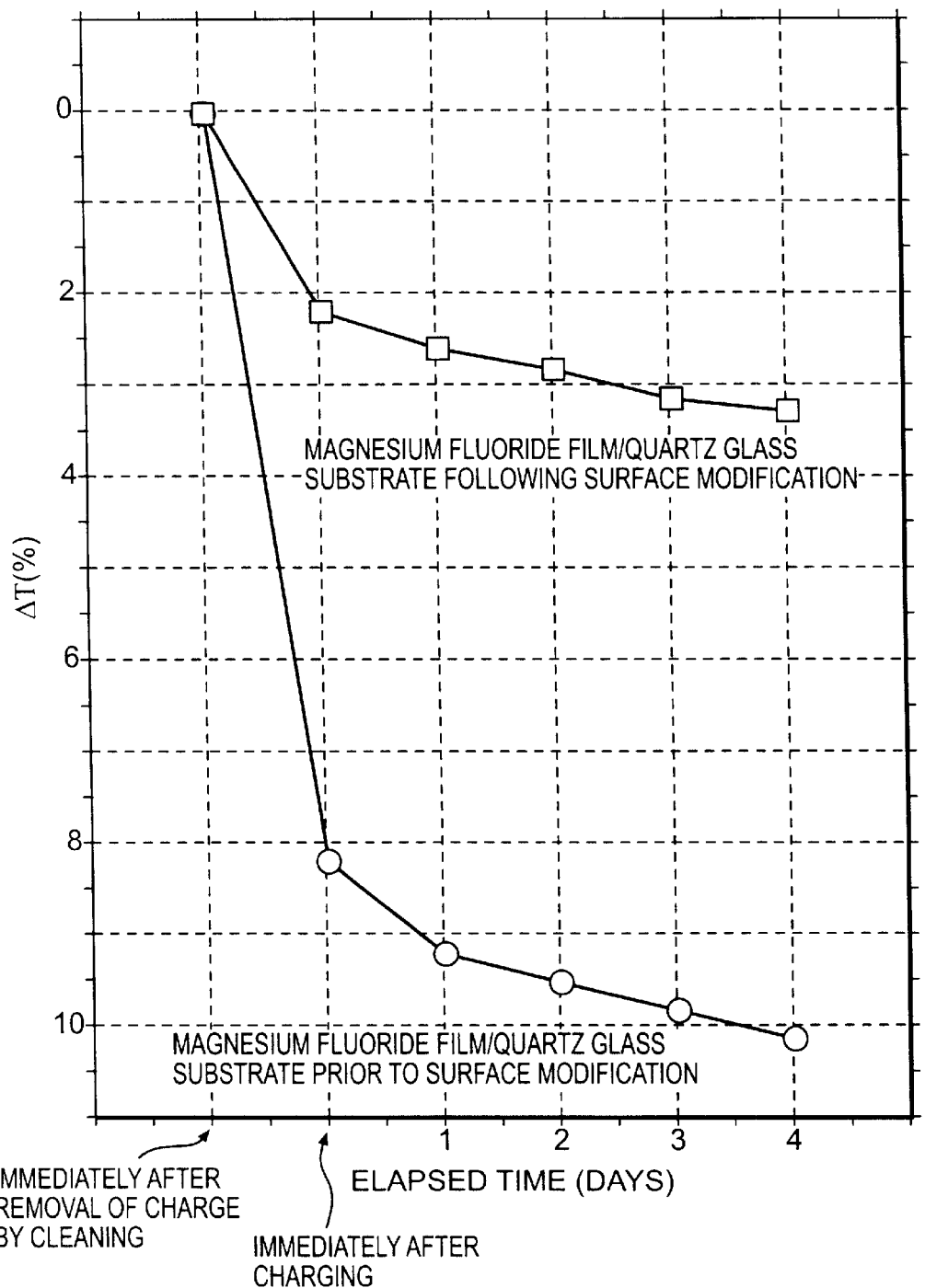
FIG. 12 is a graph which shows the change in the transmissivity of the optical element of the present invention over time during use.

Furthermore, FIG. 12 shows the results obtained when the magnesium fluoride film/quartz glass substrate was subjected to a charging treatment before and after the above-mentioned hydrophilicizing treatment, and the relationship between the transmissivity drop $\Delta T$ and elapsed time was followed. The charging treatment was performed after both samples had first been completely de-charged by washing with isopropyl alcohol. Like the above-mentioned fluorite, the magnesium fluoride film/quartz glass substrate that had not yet been subjected to the hydrophilicizing treatment showed a drop in transmissivity of 8.2% immediately after charging. In contrast, the magnesium fluoride film/quartz glass substrate that had been subjected to the hydrophilicizing treatment shows a small drop in transmissivity of 2.2% immediately after charging. Another feature common to both samples was that the change in $\Delta T$ decreased with elapsed time; however, a great difference was seen in the $\Delta T$ values themselves. In conclusion, it was possible to achieve a great amelioration of the drop in transmissivity over time, which is the most serious problem in terms of optical element performance, by subjecting the surface of the magnesium fluoride film to a hydrophilicizing treatment, so that the surface was endowed with difficult-charging/easy-charge loss characteristics.

Next, the exposure apparatus of the present invention will be described.

Figure 13:
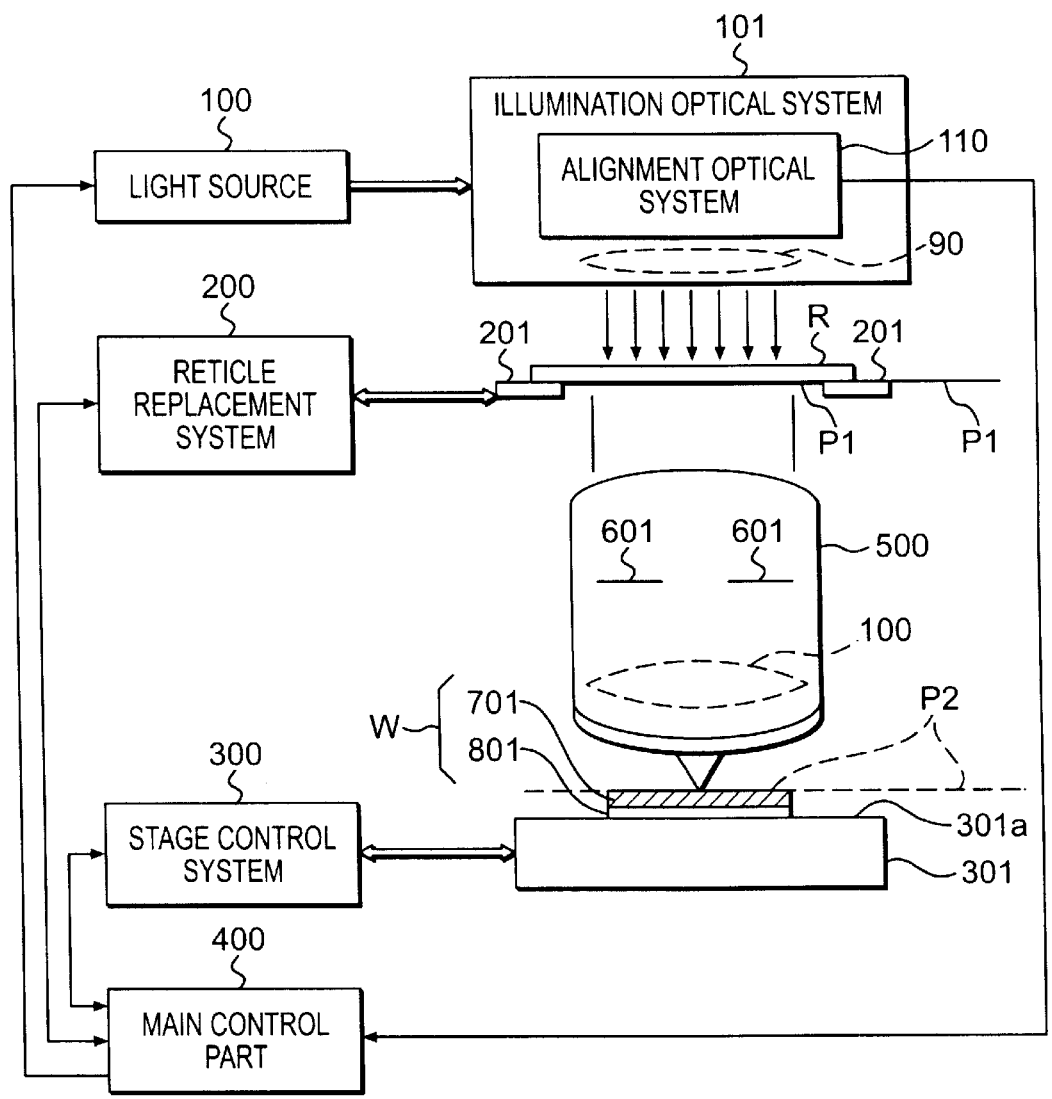
FIG. 13 is a structural diagram which illustrates the structure of the exposure apparatus of the present invention.

FIG. 13 shows the basic construction of an exposure apparatus using optical elements with a fluoride thin film obtained by the above-mentioned method and apparatus of the present invention. In particular, this can be applied to a projection exposure apparatus known as a "stepper", which is used to project an image of the pattern on a reticle onto a wafer coated with a photoresist.

As shown in FIG. 13, the exposure apparatus of the present invention is equipped with at least a wafer stage 301 which can carry a substrate W coated with a photosensitive agent on its surface 301a, an illumination optical system 101 which emits ultraviolet light in a vacuum of a specified wavelength as exposing light, and which is used to transfer the pattern of a prepared mask (reticle R) onto the substrate W, a light source 100 which is used to supply exposing light to the illumination optical system 101, and a projection optical system 500 which is used to project an image of the pattern of the mask R onto the substrate W, and which is positioned between a first surface P1 (object plane) on which the mask R is disposed and a second surface (image plane) which is caused to coincide with the surface of the substrate W. The illumination optical system 101 also includes an alignment optical system 110 which is used to adjust the relative positions of the mask R and the wafer W, and the mask R is disposed on a reticle stage 201 which can move parallel to the surface of the wafer stage 301. The reticle replacement system 200 replaces and transports the reticle (mask R) that is set on the reticle stage 201. The reticle replacement system 200 includes a stage driver that is used to move the reticle stage 201 parallel to the surface 301a of the wafer stage 301. The projection optical system 500 has an alignment optical system that is used in scanning type exposure apparatuses.

Furthermore, the exposure apparatus of the present invention uses optical elements that include fluoride thin films manufactured by the above-mentioned method of the present invention. In concrete terms, the exposure apparatus of the present invention shown in FIG. 13 may be equipped with optical lenses of the present invention as the optical lens 90 of the illumination optical system 101 and/or the optical lens 100 of the projection optical system 500.

Above, only fluorite (calcium fluoride) was described as a fluoride. Generally, however, one or more materials selected from a set consisting of magnesium fluoride, lithium fluoride, calcium fluoride, lanthanum fluoride, aluminum fluoride, cryolite, neodymium fluoride, gadolinium fluoride, yttrium fluoride, dysprosium fluoride and thiolite may be used as a fluoride that is employed as a substrate or surface layer.

Optical elements such as lenses and prisms, etc., manufactured by the manufacturing method of the present invention show little drop in transmissivity even after a long period of time has elapsed. Accordingly, such optical elements are desirable for use in optical devices such as semiconductor exposure apparatuses, microscopes, binoculars, telescopes, eyeglasses, camera lenses and medical equipment, etc., using light ranging from the visible region to the ultraviolet region, and are especially desirable for use in optical devices such as semiconductor exposure apparatuses and microscopes, etc., used in the ultraviolet region. Optical devices incorporating such optical elements can maintain a high transmissivity over a long period of time, and there is no need to stop the device for cleaning purposes.

In the present invention, as described above, fluoride optical elements can be endowed with difficult-charging characteristics which are such that the elements tend not build-up charge (i.e. by static electricity), and easy charge-loss characteristics which are such that even if the elements are charged, the charge is not retained and quickly lost. These characteristics can be achieved by replacing the F atoms at the surfaces of such fluoride optical elements with OH groups or O atoms, so that these surfaces are made hydrophilic. As a result, the absorption of substances of various sizes (ranging from polar molecules to fine particles) suspended in the air can be greatly suppressed, so that the drop in the transmissivity of the optical elements can be curtailed. Therefore, the substantial prevention of charge retention and/or substantial prevention of charge build-up on the surface of the optical element helps maintain transmissivity in the optical element. Consequently, the work of occasional cleaning of the surfaces of the optical elements that is required for maintenance purposes because of the drop in the transmissivity of the optical elements during use can be omitted. As a result, the efficiency of optical devices such as semiconductor exposure apparatuses, etc., equipped with such optical elements is increased. Since there is no need to stop such devices for the purpose of cleaning, maintenance costs can be reduced.

It will be apparent to those skilled in the art that various modifications and variations can be made in the optical element of the present invention without departing from the spirit or scope of the invention. Thus, it is intended that the present invention covers the modifications and variations of this invention provided they come within the scope of the appended claims and their equivalents.

What is claimed is:

1. An optical element manufacturing method comprising the steps of:

providing an optical element that contains fluoride in at least its surface portions, and replacing F atoms at the surface portions by OH groups or O atoms, or both.

2. The optical element manufacturing method of claim 1, wherein the fluoride is a base substrate of the optical element, or an optical thin film formed on a base substrate of the optical element; and the fluoride consists of one or more compounds selected from a group consisting of magnesium fluoride, calcium fluoride, lithium fluoride, lanthanum fluoride, aluminum fluoride, cryolite, neodymium fluoride, gadolinium fluoride, yttrium fluoride, dysprosium fluoride and thiolite.

3. The optical element manufacturing method according to claim 1, wherein the replacing of F atoms is accomplished by causing excitation-activation of at least one reactive gas selected from a group consisting of water vapor, oxygen, ozone, hydrogen peroxide and mixed gases of oxygen and hydrogen, to undergo a substitution reaction with F atoms present at the surface of the optical element.

4. The optical element manufacturing method claimed in claim 3, wherein the excitation-activation is accomplished by at least one means selected from a group consisting of conversion to plasma, laser irradiation, heating and bombardment with accelerated particles that are applied to the reactive gas.

5. An optical element manufacturing method comprising the steps of:

providing an optical element that contains fluoride in at least its surface portions; and imparting hydrophilic properties to the surface portions by replacing F atoms at the surface portions.

6. The optical element manufacturing method of claim 5, wherein the surface portions after the imparting of hydrophilic properties, have properties including at least one of substantial prevention of charge build-up and substantial prevention of charge retention, whereby maintenance of transmissivity is improved.

7. The optical element manufacturing method of claim 5, wherein the fluoride is a base substrate of the optical element or an optical thin film formed on a base substrate of the optical element; and the fluoride consists of one or more compounds selected from a group consisting of magnesium fluoride, calcium fluoride, lithium fluoride, lanthanum fluoride, aluminum fluoride, cryolite, neodymium fluoride, gadolinium fluoride, yttrium fluoride, dysprosium fluoride and thiolite.

8. The optical element manufacturing method according to claim 5, wherein the imparting hydrophilic properties is accomplished by causing excitation-activation of at least one reactive gas selected from a group consisting of water vapor, oxygen, ozone, hydrogen peroxide and mixed gases of oxygen and hydrogen, to undergo a substitution reaction with F atoms present at the surface of the optical element.

9. The optical element manufacturing method claimed in claim 8, wherein the excitation-activation is accomplished by at least one means selected from a group consisting of conversion to plasma, laser irradiation, heating and bombardment with accelerated particles that are applied to the reactive gas.

10. An optical element manufacturing method comprising the steps of:
providing an optical element that contains fluoride in at least its surface portions, and
imparting hydrophilic properties by replacing F atoms at the surface portions by OH groups or O atoms, or both; whereby the surface portions also have properties including at least one of hydrophilic, substantial prevention of charge build-up and substantial prevention of charge retention.

11. The optical element manufacturing method of claim 10, wherein the fluoride is a base substrate of the optical element, or an optical thin film formed on a base substrate of the optical element; and
the fluoride consists of one or more compounds selected from a group consisting of magnesium fluoride, calcium fluoride, lithium fluoride, lanthanum fluoride, aluminum fluoride, cryolite, neodymium fluoride, gadolinium fluoride, yttrium fluoride, dysprosium fluoride and thiolite.

12. The optical element manufacturing method according to claim 10, wherein the replacing of F atoms is accomplished by causing excitation-activation of at least one reactive gas selected from a group consisting of water vapor, oxygen, ozone, hydrogen peroxide and mixed gases of oxygen and hydrogen, to undergo a substitution reaction with F atoms present at the surface of the optical element.

13. The optical element manufacturing method claimed in claim 12, wherein the excitation-activation is accomplished by at least one means selected from a group consisting of conversion to plasma, laser irradiation, heating and bombardment with accelerated particles that are applied to the reactive gas.

* * * * *